(12) United States Patent
Siemieniec et al.

(10) Patent No.: US 8,314,489 B2
(45) Date of Patent: Nov. 20, 2012

(54) SEMICONDUCTOR MODULE AND METHOD FOR PRODUCTION THEREOF

(75) Inventors: Ralf Siemieniec, Villach (AT); Uwe Kirchner, Feldkirchen (AT)

(73) Assignee: Infineon Technologies AG, Neubiberg (DE)

( * ) Notice: Subject to any disclaimer, the term of this patent is extended or adjusted under 35 U.S.C. 154(b) by 124 days.

(21) Appl. No.: 12/881,003

(22) Filed: Sep. 13, 2010

(65) Prior Publication Data

US 2012/0061819 A1      Mar. 15, 2012

(51) Int. Cl.
*H01L 23/48*     (2006.01)
(52) U.S. Cl. ............. 257/734; 257/678; 257/E23.039; 257/E23.052; 257/E23.061; 438/106; 438/123

(58) Field of Classification Search .......... 257/678, 257/734

See application file for complete search history.

(56) References Cited

U.S. PATENT DOCUMENTS

| | | | |
|---|---|---|---|
| 6,667,547 B2 | 12/2003 | Woodworth et al. | |
| 6,724,075 B2 * | 4/2004 | Lee et al. | 257/678 |
| 7,199,461 B2 | 4/2007 | Son et al. | |
| 7,208,826 B2 * | 4/2007 | Sakamoto et al. | 257/687 |
| 7,728,413 B2 | 6/2010 | Iwade et al. | |
| 7,893,547 B2 * | 2/2011 | Huang et al. | 257/787 |
| 2007/0052072 A1 | 3/2007 | Iwade et al. | |

* cited by examiner

*Primary Examiner* — Jasmine Clark
(74) *Attorney, Agent, or Firm* — Slater, Matsil, L.L.P.

(57) ABSTRACT

This invention relates to a module including a semiconductor chip, at least two contact elements and an insulating material between the two contact elements. Furthermore, the invention relates to a method for production of such a module.

35 Claims, 10 Drawing Sheets

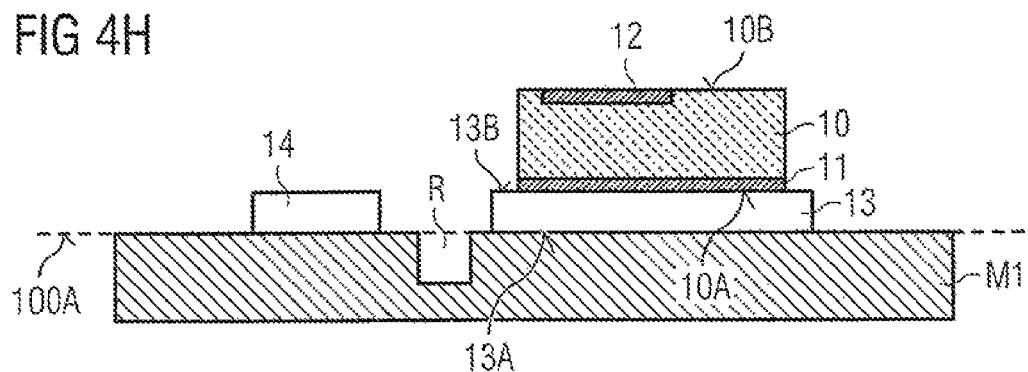
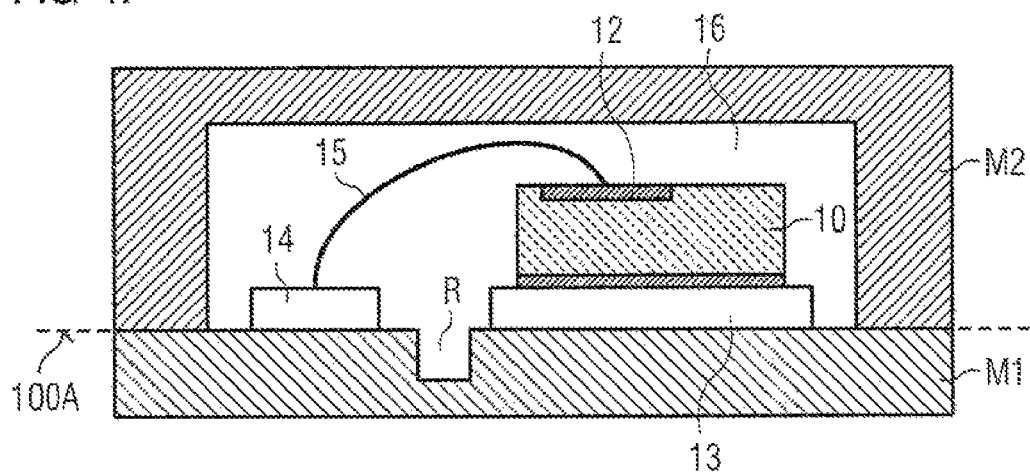
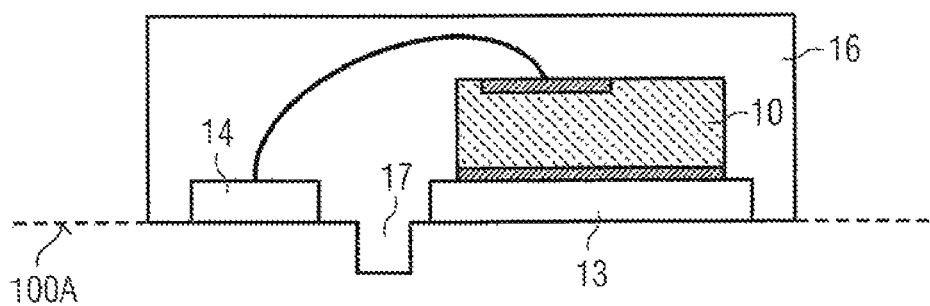

SEMICONDUCTOR MODULE AND METHOD FOR PRODUCTION THEREOF

TECHNICAL FIELD

This invention relates to a module including a semiconductor chip and at least two contact elements. Furthermore, the invention relates to a method for production of such a module.

BACKGROUND

Semiconductor modules including semiconductor chips typically have at least two or more contact elements, with different voltages being applied to the contact elements. When operating the module, undesired electrical coupling of the contact pads should be prevented. This is particularly important when reducing module dimensions and/or when very different voltages are applied to the various contact elements.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIGS. 4A-4J schematically illustrate a cross-sectional view of embodiments of methods of manufacturing a module including a semiconductor chip, a first contact element, a second contact element and an insulating material between the first and second contact element;

DETAILED DESCRIPTION OF ILLUSTRATIVE EMBODIMENTS

Figure 1A:
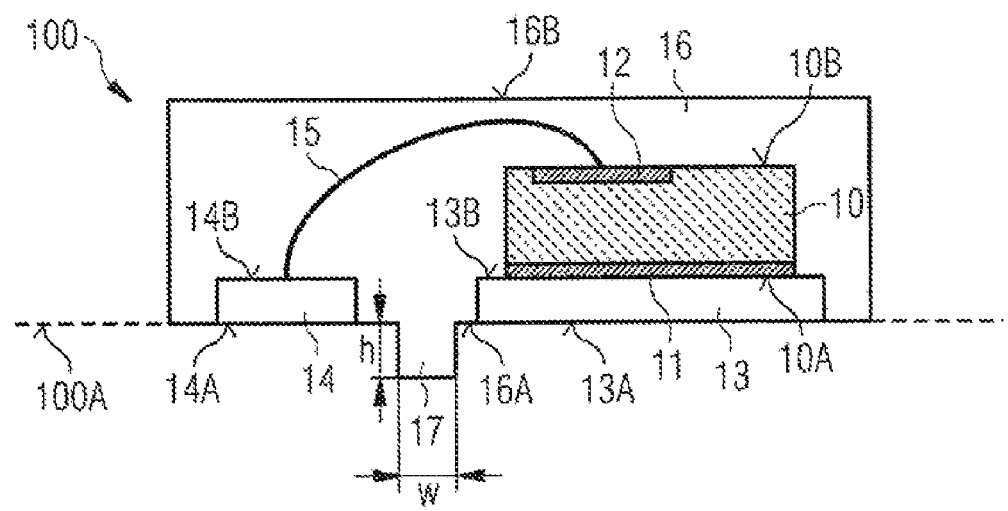
FIGS. 1A-1B schematically illustrate a cross-sectional view and a top view of one embodiment of a module including a semiconductor chip, a first contact element, a second contact element and an insulating material between the first and second contact element.

In the following detailed description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the figures being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

As employed in this specification, the terms "coupled" and/or "electrically coupled" are not meant to mean that the elements must be directly coupled together; intervening elements may be provided between the "coupled" or "electrically coupled" elements.

Modules containing semiconductor chips are described below. The modules may also be called semiconductor packages, devices or apparatus, or any other appropriate term may be used. The semiconductor chips may be of different types, may be manufactured by different technologies and may include, for example, integrated electrical, electro-optical or electro-mechanical circuits or passives. The semiconductor chips may, for example, be configured as power semiconductor chips, such as power MOSFETs (Metal Oxide Semiconductor Field Effect Transistors), IGBTs (Insulated Gate Bipolar Transistors), JFETs (Junction Gate Field Effect Transistors), power bipolar transistors or power diodes. Furthermore, the semiconductor chips may include control circuits, microprocessors or microelectromechanical components. In particular, semiconductor chips having a vertical structure may be involved, that is to say that the semiconductor chips may be fabricated in such a way that electric currents can flow in a direction perpendicular to the main surfaces of the semiconductor chips. A semiconductor chip having a vertical structure may have contact elements, in particular, on its two main surfaces, that is to say on its top side and bottom side. In particular, power semiconductor chips may have a vertical structure. By way of example, the source electrode and gate electrode of a power MOSFET may be situated on one main surface, while the drain electrode of the power MOSFET is arranged on the other main surface. Furthermore, the modules described below may include integrated circuits to control the integrated circuits of other semiconductor chips, for example, the integrated circuits of power semiconductor chips. The semiconductor chips need not be manufactured from specific semiconductor material, for example, Si, SiC, SiGe, GaAs, and, furthermore, may contain inorganic and/or organic materials that are not semiconductors, such as insulators, plastics or metals. Moreover, the semiconductor chips may be packaged or unpackaged.

The semiconductor chips may have electrodes (or contact pads) which allow electrical contact to be made with the integrated circuits included in the semiconductor chips. One or more metal layers may be applied to the electrodes of the semiconductor chips. The metal layers may be manufactured with any desired geometric shape and any desired material composition. The metal layers may, for example, be in the form of a layer covering an area. Any desired metal or metal alloy, for example, aluminum, titanium, gold, silver, copper, palladium, platinum, nickel, chromium or nickel vanadium, may be used as the material. The metal layers need not be homogenous or manufactured from just one material, that is to say various compositions and concentrations of the materials contained in the metal layers are possible. The electrodes may be situated on the active main surfaces of the semiconductor chips or on other surfaces of the semiconductor chips.

The modules described below may include external contact elements (or external contact pads), which may be of any shape and size. The external contact elements may be accessible from outside the module and may thus allow electrical contact to be made with the semiconductor chips from outside the module. Furthermore, the external contact elements may be thermally conducting and may serve as heat sinks for dissipating the heat generated by the semiconductor chips. The external contact elements may be composed of any desired electrically conductive material, for example, of a metal, such as copper, aluminum or gold, a metal alloy or an electrically conductive organic material. Solder material, such as solder balls or solder bumps, may be deposited on the external contact elements.

The semiconductor chips may be placed on carriers. The carriers may be of any shape, size and material. During the fabrication of the modules the carriers may be connected to each other. The carriers may also be made from one piece. The carriers may be connected among each other by connection means with the purpose of separating some of the carriers in the course of the fabrication. Separation of the carriers may be carried out by mechanical sawing, a laser beam, cutting, stamping, milling, etching or any other appropriate method. The carriers may be electrically conductive. They may be fabricated from metals or metal alloys, in particular, copper, copper alloys, iron nickel, aluminum, aluminum alloys, steel, stainless steel or other appropriate materials. The carriers may be entirely made of metals or metal alloys. The carriers may be, for example, a leadframe or a part of a leadframe. Furthermore, the carriers may be plated with an electrically conductive material, for example, copper, silver, iron nickel or nickel phosphorus.

The modules may include electrically insulating material. The electrically insulating material may cover any fraction of any number of surfaces of the components of the module, such as the contact elements and the semiconductor chip integrated in the module. The electrically insulating material may be used to electrically insulate components of the module from each other and/or from external components, but may also be used as a platform to mount other components, for example, wiring layers or contact elements. The electrically insulating material may be deposited using various techniques, for example, using stencil printing, screen printing or any other appropriate printing technique. Alternatively, the electrically insulating material may be laminated as a foil or sheet onto the underlying structures by applying vacuum as well as heat and pressure for a suitable time. It may also be provided that an electrically insulating material is deposited from a solution or a gas phase and may be built-up in a layer-by-layer fashion to a desired thickness. Techniques that can be employed for this kind of deposition are, for example, physical or chemical vapor deposition, spinning, dispensing, dipping, or spraying. The electrically insulating material may be fabricated from a polymer, such as parylene, a photoresist material, imide, epoxy, duroplast, a silicone, silicon nitride or an inorganic, ceramic-like material, such as silicone-carbon compounds. Furthermore, a mold material may be used as the electrically insulating material. The mold material may be any appropriate thermoplastic or thermosetting material. Various techniques may be employed to cover the components with the mold material, for example, compression molding, injection molding, powder molding or liquid molding.

The modules may have mounting surfaces. The mounting surfaces may serve to mount the module onto another component, for example, a substrate such as a circuit board, for example, a printed circuit board (PCB). The modules may, for example, be so-called surface mounted modules (SMDs), which may be mounted onto a substrate, e.g., a printed circuit board using various surface mount technologies (SMT). External contact elements may be disposed on the mounting surface to allow to electrically couple the module to the component on which the module is mounted. Solder deposits, such as solder balls, or other appropriate connection elements may be used to establish an electrical and in particular mechanical connection between the module and the component on which the module is mounted.

Figure 1B:
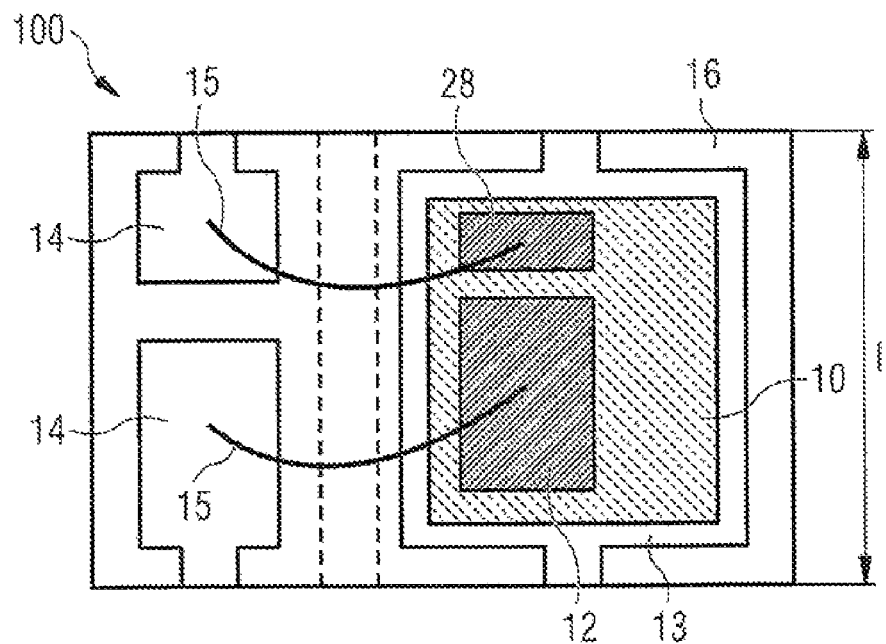

FIGS. 1A and 1B schematically illustrate a module 100. FIG. 1A depicts a cross-sectional view of the module 100, and FIG. 1B depicts a top plan view of the module 100. The module 100 includes a semiconductor chip 10, a first contact element 13, a second contact element 14, and an insulating material 16. The semiconductor chip 10 is a power semiconductor chip having a first main surface 10A and a second main surface 10B opposite of the first main surface 10A. A first electrode 11 is arranged at the first main surface 10A, and a second electrode 12 is arranged at the second main surface 10B. Semiconductor chip 10 further has a third electrode 28 arranged on the second main surface 10B.

In the case of a power MOSFET, which is exemplary shown in FIGS. 1A and 1B, the first and second electrodes 11, 12 may be drain and source electrodes (load electrodes), respectively, and the third electrode 28 may be a gate electrode (control electrode). Generally, semiconductor chip 10 may have any number of electrodes. For example, semiconductor chip 10 may have two electrodes (e.g., cathode and anode in case of a diode) or may have three or more electrodes. In one embodiment (not illustrated in the Figures), semiconductor chip 10 may have all its electrodes arranged on only one active surface. For example, semiconductor chip 10 may have a plurality of electrodes on one main surface and may be suitable for flip-chip mounting.

In module 100, semiconductor chip 10 is mounted with its first main surface 10A onto the first contact element 13 such that its first electrode 11 is electrically coupled to the first contact element 13. Electrodes 12 and 28 are electrically coupled to second contact elements 14 via bond wires 15. Although only one bond wire per electrode is shown in FIGS. 1A and 1B, any number of bond wires can be used to connect an electrode to a contact pad. Instead of bond wires, many other electrical connection means may be used, for example, pre-fabricated metal clips, metal foils or galvanically or CVD-deposited electrically conductive layers.

The contact elements 13 and 14 may, for example, be parts of a carrier, for example, may be parts of a leadframe. The leadframe may have any geometric shape and its (external) contact elements 13, 14 may be arranged in any way. The leadframe is not limited to any size, for example, the leadframe may have a thickness in the range from 100 μm to 1 mm or may be even thicker. The leadframe may be entirely manufactured from a metal, for example, copper, or a metal alloy. The leadframe may have been stamped or milled in order to generate the outer shape of the leadframe as shown in FIG. 1B. The leadframe may include further die pads and/or external contact elements which are not illustrated in FIGS. 1A and 1B.

Power semiconductor chip 10 may be placed over the contact element 13 serving as a die pad as illustrated in FIGS. 1A and 1B. The drain electrode 11 may be electrically connected to the contact element 13, and the electrical connection may, for example, be produced by reflow soldering, vacuum soldering, diffusion soldering or adhesive bonding by means of an electrically conductive adhesive.

If diffusion soldering is used as a connecting technique, it is possible to use solder materials which lead to intermetallic phases after the end of the soldering operation at the interface between the contact element 13 and the power semiconductor chip 10 on account of interface diffusion processes. In this case, the use of Sn, AuSn, AgSn, CuSn, AgIn, AuIn, CuIn, AuSi or Au solders is conceivable. If the power semiconductor chip 10 is adhesively bonded to the contact element 13, it is possible to use electrically conductive adhesives which may be based on epoxy resins and be enriched with gold, silver, nickel or copper in order to produce the electrical conductivity.

The contact elements 13 and 14 may be arranged on a common plane 100A. In the embodiment depicted in FIGS. 1A and 1B, the contact elements 13, 14 have first and second surfaces 13A, 13B and 14A, 14B, respectively, and are arranged in a common plane such that the first surfaces 13A, 14A are arranged in a common plane 100A and the second surfaces 13B, 14B are arranged in a common plane coplanar to the plane 100A. The plane 100A may form a mounting surface. The contact elements 13, 14 may be used as external contact elements to electrically access the semiconductor chip 10 from outside of the module 100. The module 100 may be a leadless module, i.e., the contact elements 13, 14 are pads rather than leads protruding laterally from the module 100.

Module 100 further includes an insulating material 16 that embeds the semiconductor chip 10 and fills a space between the first and second contact elements 13, 14. The insulating material 16 may, for example, be a mold material and may be applied via injection molding into a mold cavity into which the semiconductor chip 10 with the first and second contact elements 13, 14 and the electrical connection elements 15 has been placed.

In the embodiment illustrated in FIGS. 1A and 1B, the insulating material 16 has a planar first main surface 16A and a planar second main surface 16B. The first surface 13A of the first contact element 13, the first surface 14A of the second contact element 14 and the first main surface 16A of the insulating material 16 are arranged in the plane 100A, but may also be arranged in different planes. The surface formed by the insulating material 16, the first and second contact elements 13, 14 may form a mounting surface. The mounting surface does not necessarily have to be a planar surface, but may be a planar surface. The first and second contact elements 13, 14 may also be arranged in different planes.

In the embodiment illustrated in FIGS. 1A and 1B, the insulating material 16 has a protruding element 17 protruding from the first surface 16A of the insulating material 16. The protruding element 17A is arranged between the first and second contact elements 13, 14 at the section of the surface of the insulating material 16 that is arranged between the first and second contact elements 13, 14. The protruding element 17 may be configured to lengthen the distance between the first and second contact elements 13, 14 when measured along the surface of the insulating material 16. This distance, the so-called creepage distance, which is defined as the smallest distance between two conductors along the surface of an insulator, determines at which voltages an electronic breakthrough between the two conductors occurs. By arranging the protruding element 17 on the surface 16A of the insulating material, the creepage distance between the first and second contact elements 13, 14 is enlarged in comparison to a completely flat surface. Adding the protruding element 17 therefore allows to operate similar modules with higher voltage differences between the first and second contact elements 13, 14. During operation of the module 100, voltage differences of more than 600 V, 800 V, 1000 V, 1200 V or even more may be applied between the contact elements or the electrodes 13, 14.

In the embodiment illustrated in FIGS. 1A and 1B, the protruding element 17 is formed integrally with the insulating material 16. For example, the protruding element 17 may be formed simultaneously with and from the same material as the insulating material 16.

The protruding element 17 may have any appropriate height h, width w and length l. The height h may, for example, be larger than 0.1 mm or 0.2 mm or 0.3 mm or 0.4 mm or 0.5 mm or 0.6 mm or 0.7 mm or 0.8 mm or 0.9 mm or 1 mm or 1.5 mm or 2.0 mm or 2.5 mm. The width w of the protruding element 17 may be smaller than the distance between the first and second contact elements 13, 14. In particular, the width w may be a fraction of the distance between the first and second contact elements 13, 14, e.g., one half or one third of that distance. The width w may, for example, be larger than 0.1 mm or 0.2 mm or 0.3 mm or 0.4 mm or 0.5 mm or 0.6 mm or 0.7 mm or 0.8 mm or 0.9 mm or 1 mm or 1.5 mm or 2.0 mm or 2.5 mm. The length l of the protruding element 17 may be identical to the size of the module 100 as illustrated in FIG. 1B, or may be smaller. For example, the length l of the protruding element 17 may be similar to the size of the contact pads or may be slightly bigger. According to one embodiment, the length of the protruding element 17 may be chosen such that it obstructs any direct connection (line-of-sight connection) between portions of the contact elements. Additional end portions having a length similar to the height of the protruding element 17 may be added. In one embodiment, a plurality of protruding elements 17 may be used instead of a single protruding element 17. In this case, the widths w of the protruding elements 17 may be reduced accordingly, e.g., may correspond to the distance between the first and second contact elements 13, 14 divided by the number of protruding elements 17.

Figure 2A:
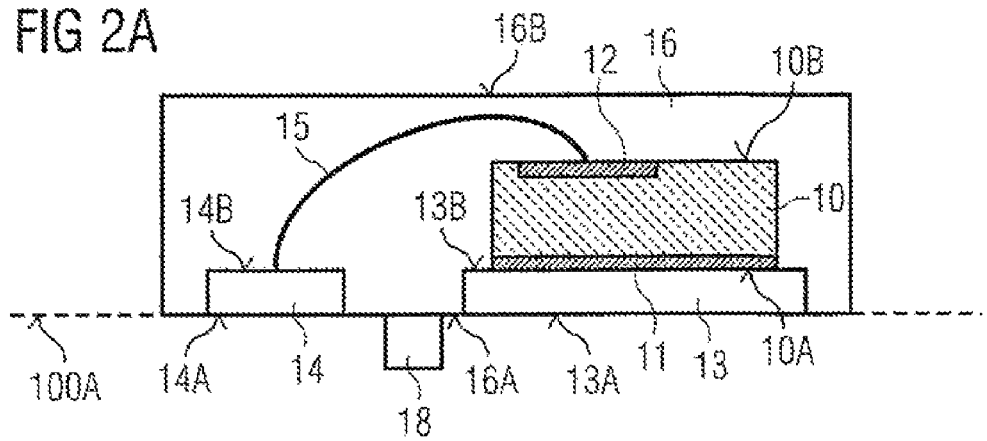
FIGS. 2A-2D schematically illustrate cross-sectional views of embodiments of a module including a semiconductor chip, a first contact element, a second contact element and an insulating material between the first and second contact element.

FIG. 2A illustrates an embodiment, wherein a protruding element 18 is not integrally formed with the insulating material 16. Instead, the protruding element 18 is formed separately and is attached to a planar surface of the insulating material 16 in an area between the first and second contact elements 13, 14. The protruding element 18 may, for example, be a bar made from the same or a different insulating material and may, for example, be attached to insulating material 16 via an adhesive. When attaching the protruding element 18 to the insulating material 16, it may be desirable to ensure that there is no gap between the protruding element 18 and the insulating material 16 in order to prevent shortcuts with smaller creepage distance. In an alternative embodiment, the protruding element 18 may be deposited from a liquid or gas phase onto the insulating material 16 and may adhere to the insulating material 16 without the need of additional adhesives.

Figure 2B:
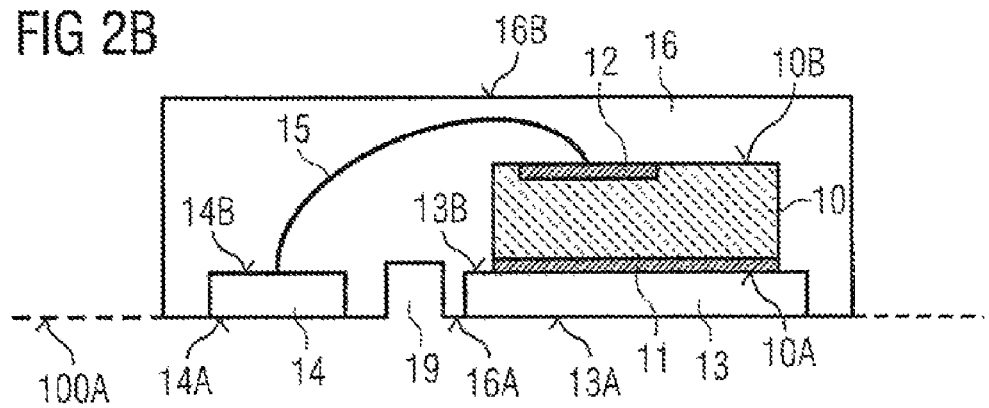

FIG. 2B schematically illustrates an embodiment, wherein a recess 19 is formed in the insulating material 16. Similar to the protruding elements 17, 18 described above, the recess 19 allows to enlarge the creepage distance compared to a completely planar surface of the insulating material 16. The recess 19 may, for example, be formed by removing material from the insulating material 16 or by not applying insulating material to the area where the recess 19 is to be formed, for example, by using a suitable molding cavity. The dimensions of the recess 19 may be similar to the dimensions of the protruding portions described above.

Figure 2C:
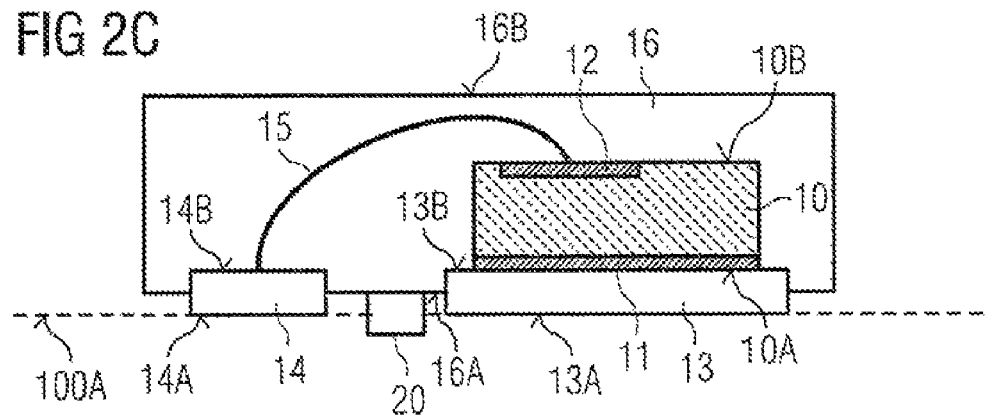

FIG. 2C schematically illustrates an embodiment, wherein the first surface 16A of the insulating material 16 and the common plane 100A formed by the first surfaces 13A, 14A of the first and second contact elements 13, 14 are arranged in different planes. The side faces of the first and second contact elements 13, 14 are only partially covered with the insulating material 16, and the mounting surface formed by surfaces 13A, 14A and 16A does not form a planar surface. The first surface 16A of the insulating material 16 may be arranged anywhere between the planes defined by the first surface 13A and the second surface 13B of the first contact element 13. Similar to the embodiments described above, a protruding element 20 is applied to the first surface 16A of the insulating material 16.

Figure 2D:
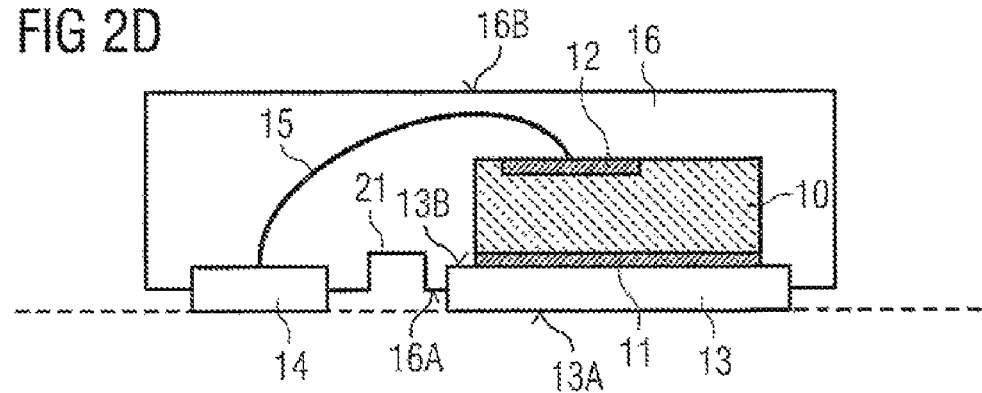

FIG. 2D schematically illustrates an embodiment, wherein the first surface 16A of the insulating material 16 is retracted with regard to the contact elements 13, 14 similar to the embodiment illustrated in FIG. 2C. The embodiment illustrated in FIG. 2D differs from the embodiment illustrated in FIG. 2C in that a recess 21 is provided in the first surface 16A of the insulating material 16 instead of a protruding element 20.

Figure 3A:
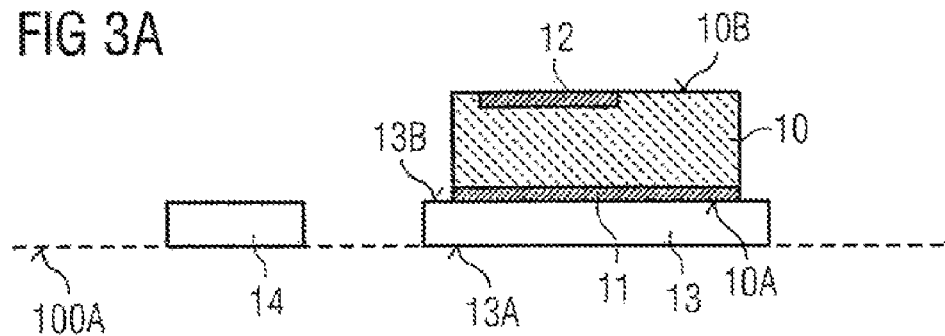
FIGS. 3A-3D schematically illustrate a cross-sectional view of an embodiment of a method of manufacturing a module including a semiconductor chip, a first contact element, a second contact element and an insulating material between the first and second contact element.
Figure 3B:
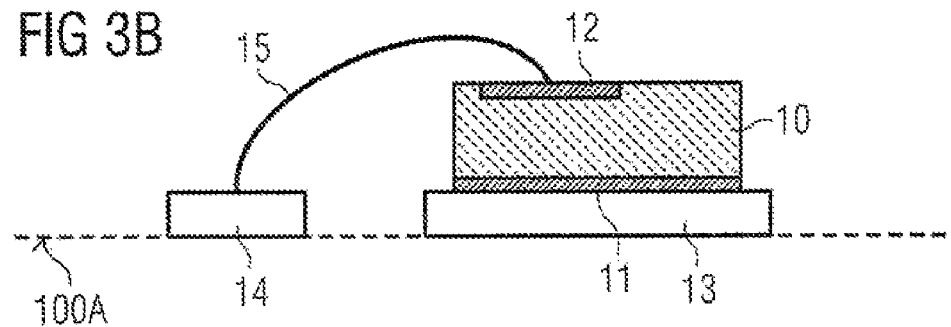
Figure 3C:
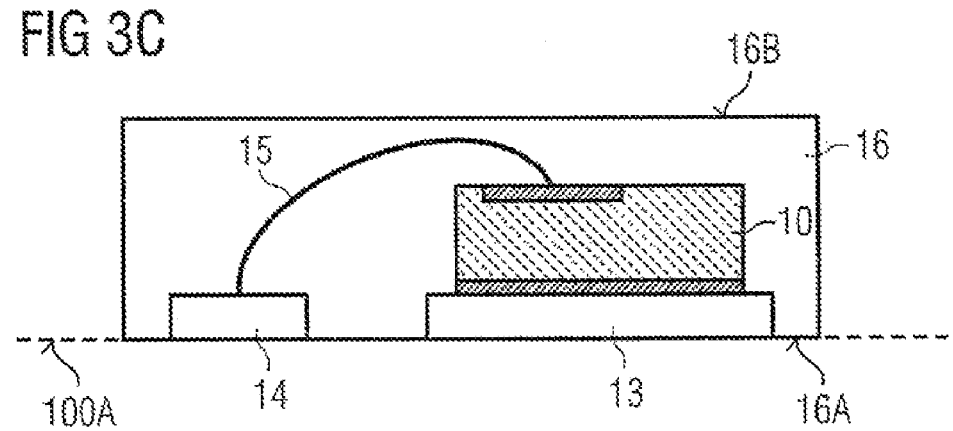
Figure 3D:
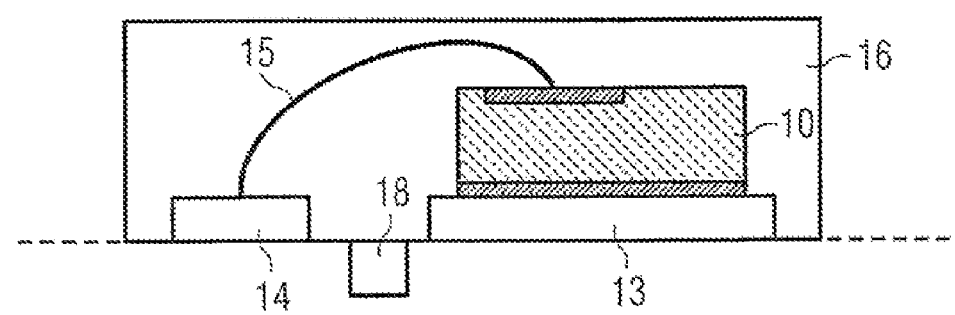

FIGS. 3A-3D schematically illustrate a method for production of the module illustrated in FIG. 3D. The module illustrated in FIG. 3D is an implementation of the module shown in FIG. 2A. The details of the module described below with reference to FIGS. 3A-3D can therefore be likewise applied to the module illustrated in FIG. 2A and vice versa. Similar or identical components of the modules are denoted by the same reference numerals.

FIG. 3A schematically illustrates a first step, wherein contact elements 13, 14 are provided. The contact elements 13, 14 may, for example, be portions of a leadframe and may be provided on a common plane 100A. The first contact element 13 has a first surface 13A and a second surface 13B. A semiconductor chip 10 is provided, having a first main surface 10A with a first electrode 11 and a second main surface 10B opposite of the first main surface 10A. Semiconductor chip 10 is placed onto and is attached to the first contact element 13, for example, using solder, intermetallic bonds or conductive adhesives, so that the first contact element 13 is electrically coupled to the first electrode 11. In the embodiment illustrated in FIG. 3A, semiconductor chip 10 further has a second electrode 12 on its second main surface 10B.

FIG. 3B schematically illustrates a second step, wherein the second electrode 12 of semiconductor chip 10 is electrically coupled to the second contact element 14 via a bond wire 15. As has been explained above, many other techniques may be used for connecting the second electrode 12 to the second contact element 14. In one embodiment (not illustrated), it may be provided that the second electrode 12 is also arranged on the first main surface 10A of the semiconductor chip 10, and that the semiconductor chip 10 is placed over both the first and second contact elements 13, 14.

FIG. 3C schematically illustrates a third step, wherein the module illustrated in FIG. 3B is covered with insulating material 16. For example, the insulating material 16 may be applied using a mold process. In one embodiment, the module depicted in FIG. 3B may be placed into a mold cavity. In another embodiment, the contact elements 13, 14 illustrated in FIG. 3A may be placed onto a molding plate, which forms a part of a mold cavity, e.g., the lower half of a mold cavity. The molding plate may, for example, provide the common plane 100A illustrated in FIG. 3A. The molding cavity may be formed by an upper half applied over the lower half. After the molding step, the molding cavity may be removed to obtain the module illustrated in FIG. 3C. The insulating material 16 may have a first main surface 16A and a second main surface 16B opposite of the first main surface 16A. The main surface 16A of the insulating material 16 may be arranged in the plane 100A and may form together with the contact elements 13, 14 a planar mounting surface.

FIG. 3D schematically illustrates a fourth step, wherein a protruding element 18 is added to the module illustrated in FIG. 3C. The protruding element 18 may, for example, be pre-fabricated and may be attached to the insulating material 16 in an area between the first and second contact element 13, 14 via an adhesive. The protruding element 18 may also be deposited onto the insulating material 16 from a liquid or gas phase and may be hardened to obtain the module illustrated in FIG. 3D.

FIGS. 4A-4J schematically illustrate methods for production of the module illustrated in FIGS. 1A and 1B. The details of the module described below with reference to FIGS. 4A-4J can therefore be likewise applied to the module illustrated in FIGS. 1A and 1B and vice versa. Similar or identical components of the modules are denoted by the same reference numerals.

Figure 4A:
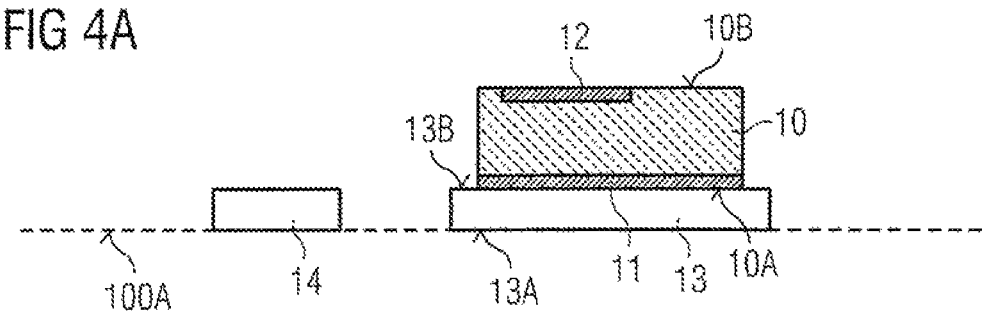
Figure 4B:
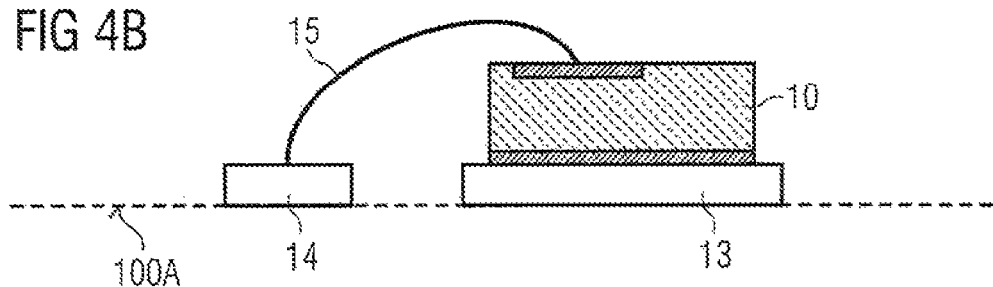

FIGS. 4A and 4B illustrate a first and a second fabrication step, which are identical to the first and second steps described above with respect to FIGS. 3A and 3B.

Figure 4C:
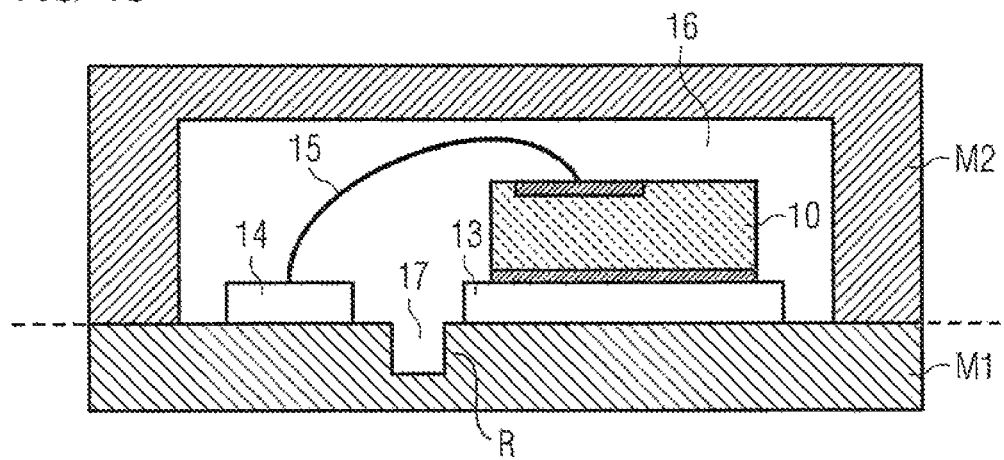

FIG. 4C illustrates a third step for the case where a mold material is used as the insulating material 16. The semiconductor chip 10 and the first and second contact elements 13, 14 are placed into a mold cavity M1, M2 for application of an insulating mold material 16. More specifically, the module depicted in FIG. 4B is placed onto a molding plate M1, which forms the lower half of the mold cavity M1, M2, and is covered by an upper half M2 of the mold cavity M1, M2. The lower half M1 of the mold cavity has a recess R for forming a protruding element 17 protruding from the common plane 100A defined by the first and second contact elements 13, 14.

Figure 4D:
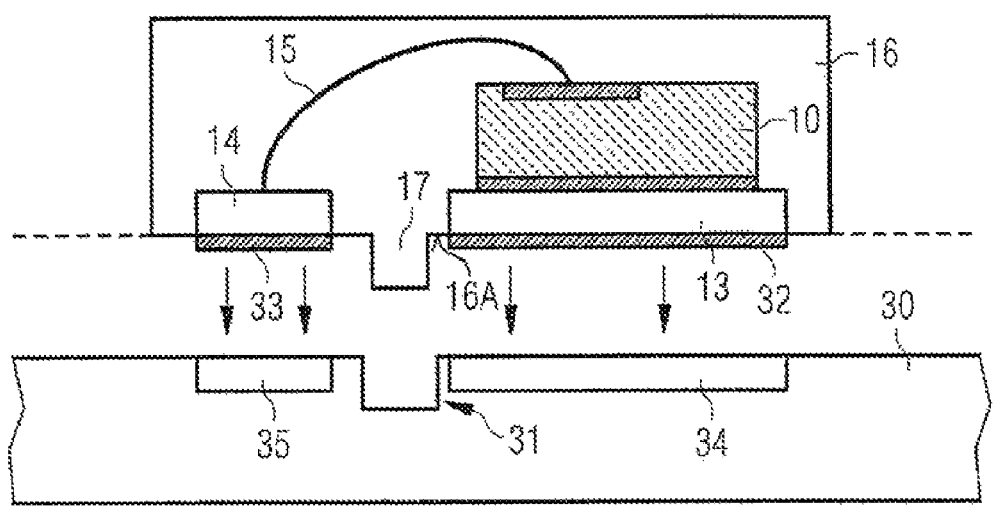
Figure 4E:
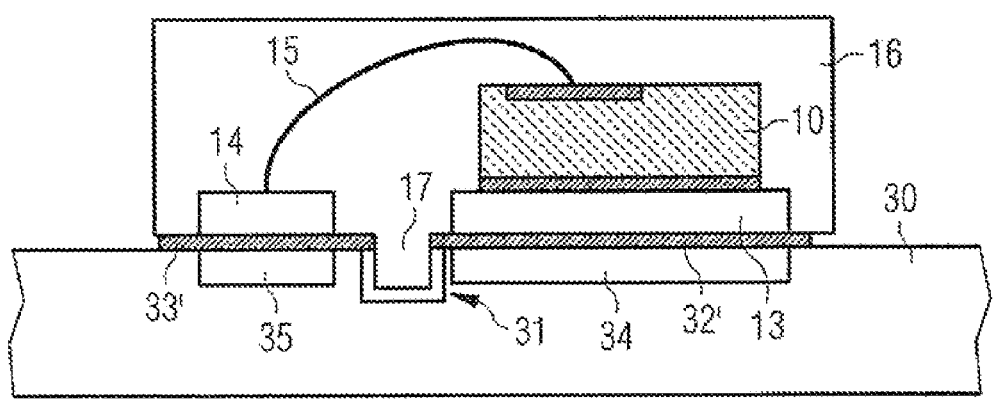

FIG. 4D illustrates a fourth step, after removing the molded semiconductor module from the mold cavity M1, M2. The molded semiconductor module is placed onto a substrate 30. The substrate 30 includes first and second terminals 34, 35, onto which the first and second contact elements 13, 14 are placed. The first and second contact elements 13, 14 shall be electrically coupled with and shall be mechanically attached to the first and second terminals 34, 35 on the substrate 30. This can, for example, be achieved by adding solder 32, 33 to the first and second contact elements 13, 14 as illustrated in FIG. 4D, and by soldering the first and second contact elements 13, 14 to the first and second terminals 34, 35 of the substrate 30. The molded semiconductor module may be placed over the substrate 30 such that the protruding element 17 is placed over a recess 31 provided in the substrate 30. The recess 31 in the substrate 30 may be configured to accommodate the protruding element 17 protruding from the first surface 16A of the insulating material 16 as illustrated in FIG. 4E. In one embodiment, the solder material 32, 33 is applied to the first and second terminals 34, 35 of the substrate 30 instead of the first and second contact elements 13, 14. In one embodiment, the solder material 32, 33 may be applied to each one of the contact elements 13, 14 and the terminals 34, 35.

The recess 31 in the substrate 30 may be slightly larger than the protruding element 17 so as to comfortably accommodate the protruding element 17, and may be large enough to allow for some misalignment between the molded semiconductor module and the substrate 30.

In one embodiment, the size of the recess 31 may be small enough so that the protruding element 17 can prevent solder material 32, 33 from flowing to the respective other contact when the molded chip is pressed onto the substrate 30. In other words, the recess 31 may be small enough so that the protruding element 17 can effectively seal the connection between the first and the second contact element 13, 14. Thus, due to the protruding element 17 fitting into the recess 31, the solder material 32 cannot flow to the contact elements 14, 35, and the solder material 33 cannot flow to the contact elements 13, 34.

FIG. 4E schematically illustrates the resulting system after soldering the module 100 to the substrate 30. The solder material 32', 33' has spread laterally during pressing the molded chip onto the substrate 30, but the protruding element 17 fitted into the recess 31 has effectively prevented the two solder materials 32', 33' from getting into electrical contact with each other and from getting too close to each other to allow for electrical connection via creepage currents.

Figure 4F:
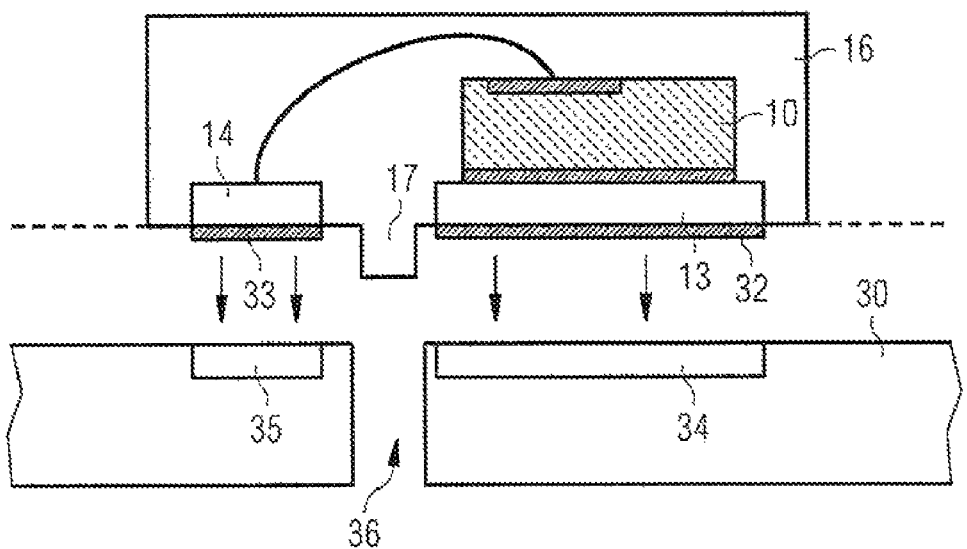
Figure 4G:
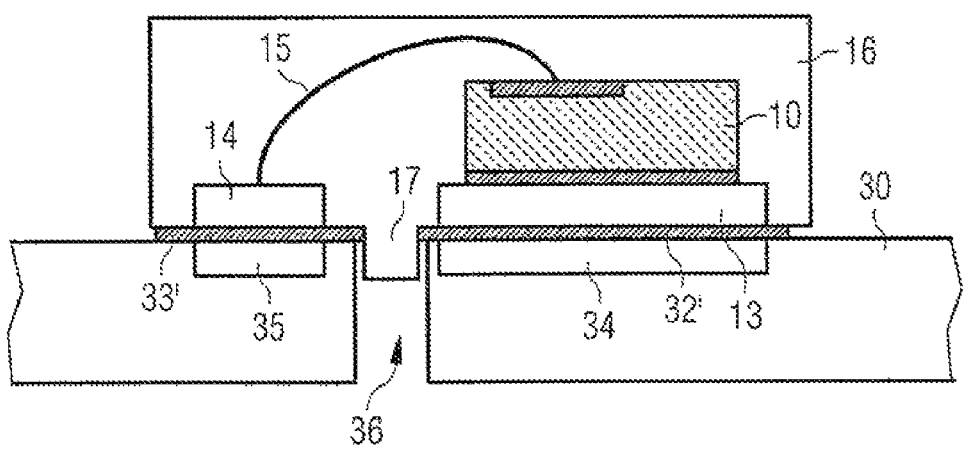

FIGS. 4F and 4G schematically illustrate an embodiment, wherein the recess 31 illustrated in FIGS. 4D and 4E is a through-hole 36 that extends through the whole substrate 30. The recess 31 may, for example, be formed by etching or drilling, whereas the through-hole 36 may also be formed by stamping or other processes.

FIGS. 4H-4J illustrate an alternative for applying the insulating material 16.

FIG. 4H illustrates a first step of this method, wherein the components of the module are arranged on a molding plate M1. Accordingly, a molding plate M1 is provided first. The molding plate M1 has a planar surface with a recess R. Then, first and second contact elements 13, 14 are applied to the molding plate M1. The surface of the molding plate M1, and the surfaces 13A, 14A of the first and second contact elements 13, 14 form a common plane 100A. A semiconductor chip 10 having a first main surface 10A with a first electrode 11 and second main surface 10B having a second electrode 12 is placed over and is attached to the first contact element 13 such that the first electrode 11 is electrically coupled to the first contact element 13.

FIG. 4I schematically illustrates a second step, wherein a bond wire 15 is attached to the second electrode 12 and the second contact element 14. Then, a mold cavity M2 is placed over the module in order to embed the semiconductor chip 10, the first and second contact elements 13, 14 and the bond wire 15 in a mold compound 16. The mold material 16 also fills the recess R in the molding plate M1.

FIG. 4J illustrates the module after removing the mold cavity M2 and the mold plate M1.

FIGS. 5A-5G schematically illustrate embodiments of methods for producing the module illustrated in FIG. 2B. The details of the modules described below with reference to FIGS. 5A-5G can therefore be likewise applied to the module illustrated in FIG. 2B and vice versa. Similar or identical components of the modules are denoted by the same reference numerals.

Figure 5A:
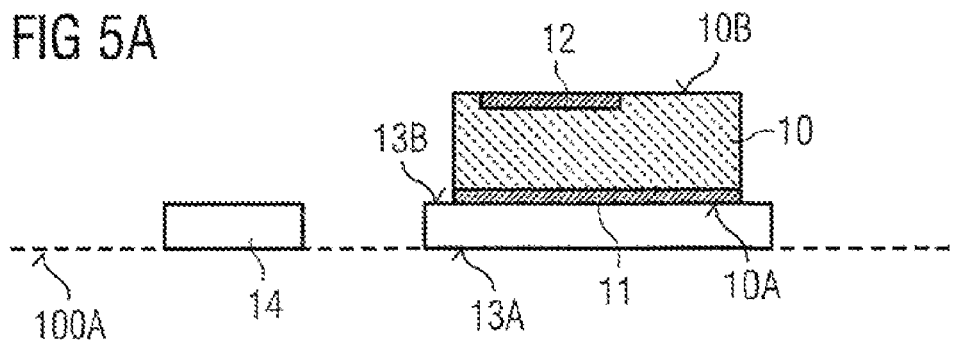
FIGS. 5A-5G schematically illustrate a cross-sectional view of embodiments of methods of manufacturing a module including a semiconductor chip, a first contact element, a second contact element and an insulating material between the first and second contact element.
Figure 5B:
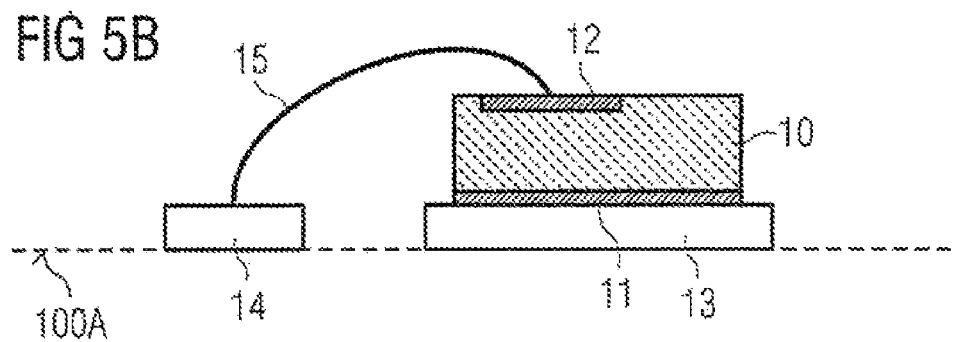
Figure 5C:
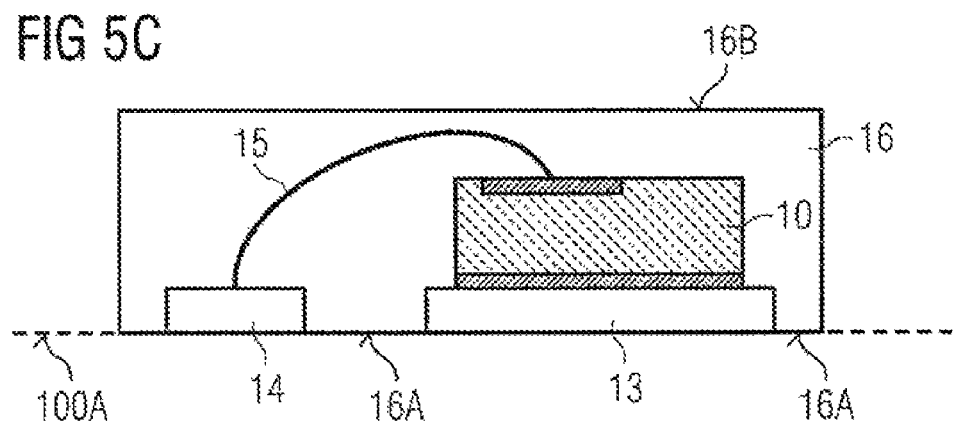

FIGS. 5A-5C schematically illustrate a first, second and third step, which are identical to the first, second and third step described above with respect to FIGS. 3A-3C.

Figure 5D:
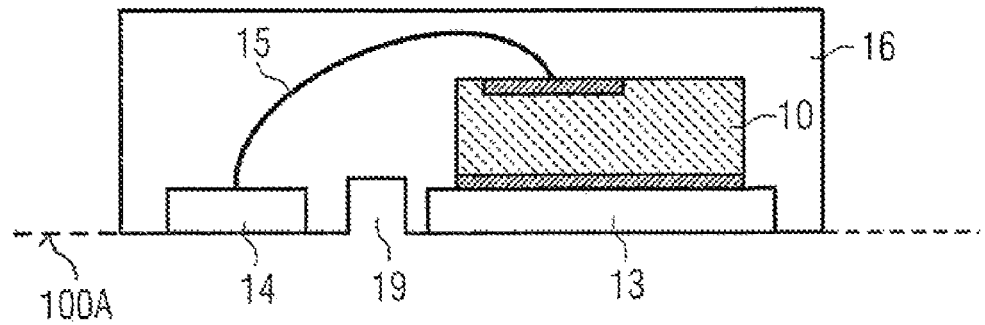

FIG. 5D illustrates a fourth step, wherein a recess 19 has been formed in the insulating material 16 by removing material from the planar surface of the insulating material in an area between the first and second contact element 13, 14. The material may, for example, have been removed by etching, drilling, photolithographic techniques or other suitable methods.

Figure 5E:
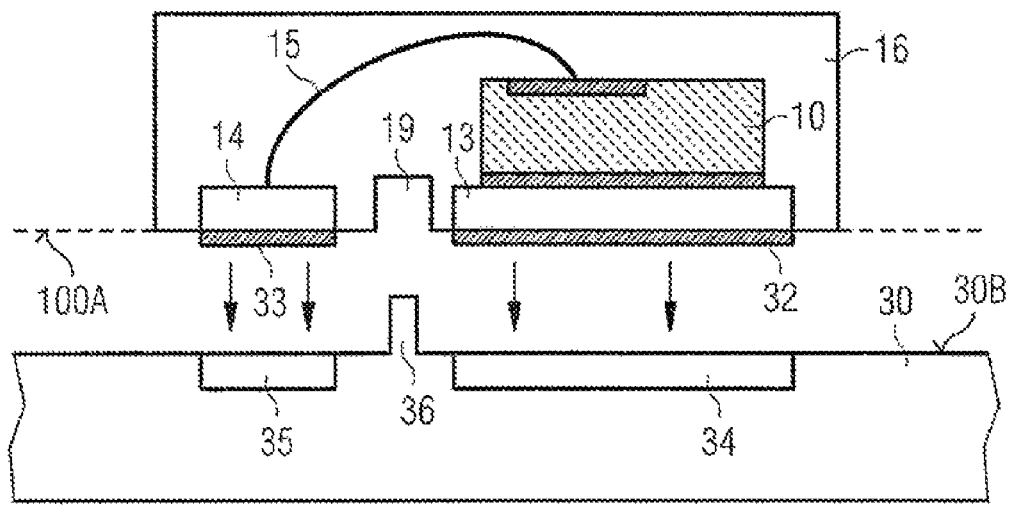

FIG. 5E illustrates a fifth step, wherein the module illustrated in FIG. 5D is placed onto a substrate 30. Similar to the embodiment illustrated in FIG. 4D, the substrate 30 has first and second terminals 34 and 35. The substrate 30 in the embodiment illustrated in FIG. 5E does not have a recess 31, but instead has a protruding element 36 protruding from a main surface 30B of the substrate 30.

In the embodiment illustrated in FIG. 5E, the molded semiconductor chip is placed over the substrate 30 for the soldering step such that the recess 19 in the molded semiconductor module accommodates the protruding element 36 protruding from the substrate 30.

The dimension of recess 19 relative to protruding element 36 may be similar as described above, i.e. may allow for lateral misalignment and/or may allow sealing of the gap between the two components.

Figure 5F:
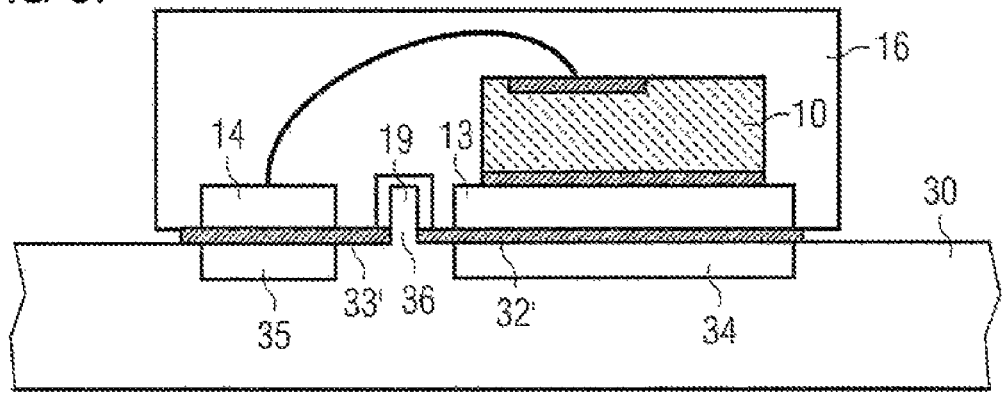

FIG. 5F schematically illustrates the resulting module after soldering the molded chip to the substrate 30. The solder material 32', 33' has spread laterally during pressing the molded chip onto the substrate 30, but the protruding element 36 and the accommodating recess 19 have effectively prevented the two solder materials 32', 33' from getting into electrical contact with each other and from getting too close to each other to allow for electrical connection via creepage currents.

Figure 5G:
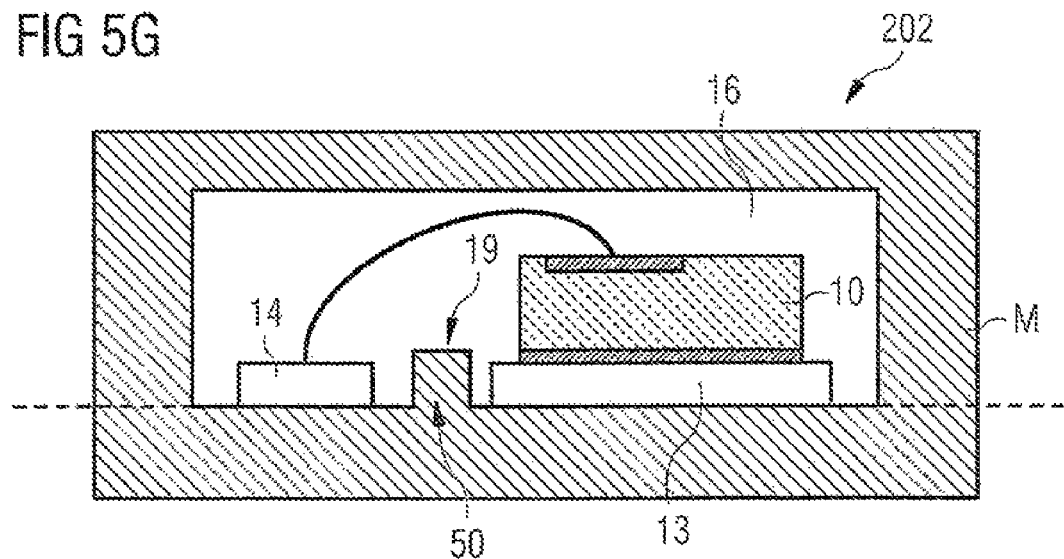

FIG. 5G schematically illustrates an alternative to the method step illustrated in FIG. 5C. In the embodiment illustrated in FIG. 5G, a mold cavity having a protruding element 50 is used for generating the recess 19 in the insulating material 16. This allows to generate the recess simultaneously with applying the insulating material 16.

FIGS. 6A-6H schematically illustrate embodiments of the protruding elements or recesses formed in or on the insulating material 16.

Figure 6A:
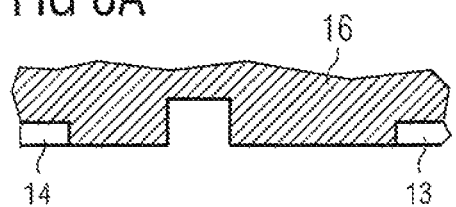
FIGS. 6A-6H schematically illustrate cross-sectional views of different arrangements of insulating material between a first and a second contact element.
Figure 6E:
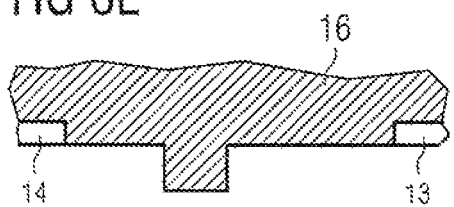

FIG. 6A illustrates an embodiment wherein the recess has a rectangular cross-section. The cross-section does not have to be perfectly rectangular, but may also have slightly rounded edges.

Figure 6B:
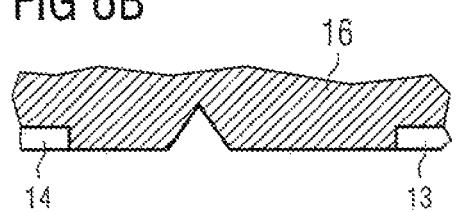
Figure 6F:
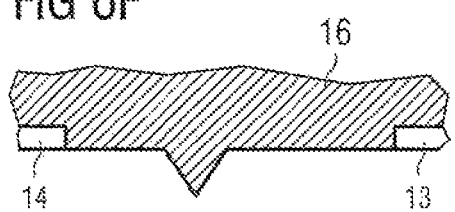

FIG. 6B illustrates an embodiment wherein the recess has a triangular cross-section. Again, the cross-section does not have to be perfectly triangular, but may also have slightly rounded edges.

Figure 6C:
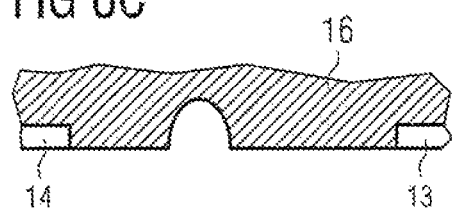
Figure 6G:
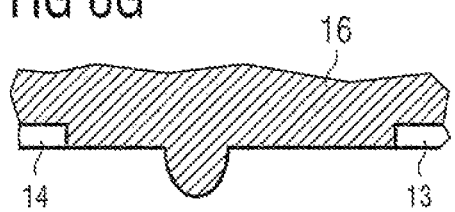

FIG. 6C illustrates an embodiment wherein the recess has a concave curved cross-section. Such a cross-section may, for example, be obtained by etching processes.

Figure 6D:
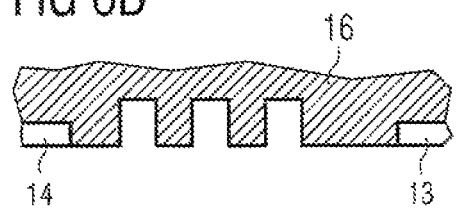
Figure 6H:
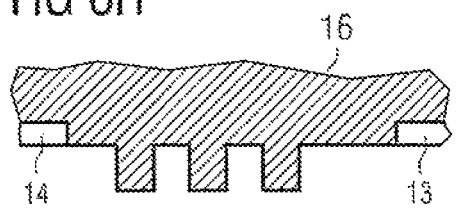

FIG. 6D illustrates an embodiment having a plurality of rectangular recesses. The recesses do not necessarily have to be equal. For example, there may also be a plurality of differently shaped recesses.

FIGS. 6E-6H illustrate embodiments having the same shapes as illustrated in

FIGS. 6A-6D, but with protruding elements instead of recesses.

Apart from the embodiments illustrated in FIGS. 6A-6H, there may also be embodiments with combinations of differently shaped and/or differently sized protruding elements or recesses. Protruding elements and recesses may also be combined. The size and shape of the protruding elements or recesses of the substrates on which the modules are placed may be varied accordingly.

It is obvious to a person skilled in the art that the modules described above are only intended to be exemplary embodiments, and many variations are possible. For example, the modules discussed above may be produced in a batch process, wherein a plurality of similar modules is produced simultaneously and in parallel. If necessary, the modules may be separated from one another by separation of the leadframe. Separating the leadframe may, for example, be performed by sawing, cutting, etching or a laser beam or other electromagnetic radiation.

In addition, while a particular feature or aspect of an embodiment of the invention may have been disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". Furthermore, it should be understood that embodiments of the invention may be implemented in discrete circuits, partially integrated circuits or fully integrated circuits or programming means. Also, the term "exemplary" is merely meant as an example, rather than the best or optimal. It is also to be appreciated that features and/or elements depicted herein are illustrated with particular dimensions relative to one another for purposes of simplicity and ease of understanding, and that actual dimensions may differ substantially from that illustrated herein.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A module, comprising:
   a semiconductor chip;
   a first contact element and a second contact element spaced from and electrically coupled to the semiconductor chip, wherein a surface of the first contact element and a surface of the second contact element are arranged in a common plane;
   an electrically insulating material having a planar surface in an area between the first contact element and the second contact element;
   a protruding element protruding from the planar surface of the electrically insulating material and/or a recess in the planar surface of the electrically insulating material; and
   a substrate comprising a first terminal that is in electrical contact with the first contact element and a second terminal that is in electrical contact with the second contact element.

2. The module of claim 1, wherein the protruding element or recess comprises a protruding element that is integrally formed with the electrically insulating material.

3. The module of claim 1, wherein the planar surface of the electrically insulating material is arranged in the common plane.

4. The module of claim 1, wherein the semiconductor chip has a first electrode on a first main surface and a second electrode on a second main surface opposite to the first main surface and the first contact element is electrically coupled to the first electrode and the second contact element is electrically coupled to the second electrode.

5. The module of claim 1, wherein the first contact element and the second contact element are parts of a leadframe on which the semiconductor chip is placed.

6. The module of claim 1, wherein the substrate has a protruding element protruding into the recess in the electrically insulating material and/or a recess accommodating the protruding element protruding from the electrically insulating material.

7. The module of claim 1, wherein the substrate is a printed circuit board.

8. A module, comprising:
   a semiconductor chip;
   a first contact element and a second contact element spaced from and electrically coupled to the semiconductor chip;
   an electrically insulating material embedding the semiconductor chip, wherein the electrically insulating material, the first contact element and the second contact element form a mounting surface, the first and second contact elements extending into the electrically insulating material in a direction toward the semiconductor chip; and
   a recess protruding from the mounting surface between the first contact element and the second contact element, the recess extending into the electrically insulating material in the direction toward the semiconductor chip.

9. The module of claim 8, wherein the recess is integrally formed with the electrically insulating material.

10. The module of claim 8, wherein the module is a leadless module.

11. The module of claim 8, wherein the first contact element and the second contact element are embedded in the electrically insulating material and a surface of the first contact element and a surface of the second contact element are exposed from the electrically insulating material at the mounting surface.

12. A system, comprising:
    a module, comprising:
       a semiconductor chip;
       a first contact element and a second contact element spaced from and electrically coupled to the semiconductor chip, the semiconductor chip overlying the first contact element;
       an electrically insulating material embedding the semiconductor chip, wherein the electrically insulating material, the first contact element and the second contact element form a mounting surface; and
       a protruding element protruding from the mounting surface between the first contact element and the second contact element; and
    a substrate comprising a recess, wherein the module is mounted on the substrate with the mounting surface of the module facing the substrate and the recess of the substrate accommodating the protruding element of the module.

13. The system of claim 12, wherein the module is a leadless module.

14. The system of claim 12, wherein the substrate is a printed circuit board.

15. The system of claim 12, wherein the semiconductor chip does not overlie the second contact element.

16. A method, comprising:
    providing a semiconductor chip, a first contact element electrically coupled to the semiconductor chip and a second contact element electrically coupled to the semiconductor chip, wherein a surface of the first contact element and a surface of the second contact element are arranged in a common plane, wherein the semiconductor chip has a first electrode on a first main surface and a second electrode on a second main surface opposite to the first main surface and the first contact element is electrically coupled to the first electrode and the second contact element is electrically coupled to the second electrode;

embedding the semiconductor chip in an electrically insulating material, with the electrically insulating material having a planar surface in an area between the first contact element and the second contact element; and forming a protruding element that protrudes from the planar surface of the electrically insulating material and/or a recess in the planar surface of the electrically insulating material.

17. The method of claim 16, wherein the protruding element or the recess is formed when the semiconductor chip is embedded in the electrically insulating material.

18. The method of claim 16, wherein the planar surface of the electrically insulating material is arranged in the common plane.

19. A method comprising:
providing a semiconductor chip, a first contact element electrically coupled to the semiconductor chip and a second contact element electrically coupled to the semiconductor chip, wherein a surface of the first contact element and a surface of the second contact element are arranged in a common plane;
embedding the semiconductor chip in an electrically insulating material, with the electrically insulating material having a planar surface in an area between the first contact element and the second contact element;
forming a protruding element that protrudes from the planar surface of the electrically insulating material and/or a recess in the planar surface of the electrically insulating material; and
attaching a substrate to the first and second contact elements, wherein the substrate has a recess or a throughhole for accommodating the protruding element protruding from the electrically insulating material or has a protruding element protruding into the recess in the electrically insulating material.

20. A method, comprising:
providing a module, comprising:
a semiconductor chip;
a first contact element and a second contact element spaced from and electrically coupled to the semiconductor chip;
an electrically insulating material embedding the semiconductor chip, wherein the electrically insulating material, the first contact element and the second contact element form a mounting surface; and
a protruding element protruding from the mounting surface between the first contact element and the second contact element; and
mounting the module on a substrate, wherein the module is mounted on the substrate with the mounting surface of the module facing the substrate and a recess of the substrate accommodating the protruding element of the module, wherein the substrate is a printed circuit board.

21. The method of claim 20, wherein the module is a leadless module.

22. A module, comprising:
a semiconductor chip, wherein the semiconductor chip has a first electrode on a first main surface and a second electrode on a second main surface opposite to the first main surface;
a first contact element and a second contact element spaced from and electrically coupled to the semiconductor chip, wherein a surface of the first contact element and a surface of the second contact element are arranged in a common plane, wherein the first contact element is electrically coupled to the first electrode and the second contact element is electrically coupled to the second electrode;
an electrically insulating material having a planar surface in an area between the first contact element and the second contact element; and
a protruding element protruding from the planar surface of the electrically insulating material and/or a recess in the planar surface of the electrically insulating material.

23. The module of claim 22, wherein the protruding element or recess comprises a protruding element that is integrally formed with the electrically insulating material.

24. The module of claim 22, wherein the planar surface of the electrically insulating material is arranged in the common plane.

25. The module of claim 22, wherein the first contact element and the second contact element are parts of a leadframe on which the semiconductor chip is placed.

26. A system, comprising:
a module, comprising:
a semiconductor chip;
a first contact element and a second contact element spaced from and electrically coupled to the semiconductor chip;
an electrically insulating material embedding the semiconductor chip, wherein the electrically insulating material, the first contact element and the second contact element form a mounting surface; and
a protruding element protruding from the mounting surface between the first contact element and the second contact element; and
a printed circuit board comprising a recess, wherein the module is mounted on the printed circuit board with the mounting surface of the module facing the printed circuit board and the recess of the printed circuit board accommodating the protruding element of the module.

27. A method, comprising:
mounting a semiconductor chip on a first contact element so that a bottom terminal on a bottom side of the semiconductor chip is electrically coupled first contact element;
electrically connecting a top terminal of the semiconductor chip to a second contact element that is laterally spaced from the first contact element, the top terminal on a top side of the semiconductor chip, the top side opposite the bottom side; and
embedding the semiconductor chip in an electrically insulating material, such that a surface of the electrically insulating material includes a protruding element or a recess between the first contact element and the second contact element.

28. The method of claim 27, wherein the surface of the electrically insulating material includes a recess between the first contact element and the second contact element.

29. The method of claim 27, wherein the surface of the electrically insulating material includes a protruding element between the first contact element and the second contact element.

30. The method of claim 27, wherein electrically connecting the top terminal of the semiconductor chip to the second contact element comprises wire bonding.

31. The method of claim 27, wherein the protruding element or the recess is formed when the semiconductor chip is embedded in the electrically insulating material.

32. The method of claim 27, further comprising electrically connecting a second top terminal of the semiconductor chip to a third contact element, the second top terminal on the top side of the semiconductor chip.

33. The method of claim 32, wherein the semiconductor chip comprises a power transistor.

34. The method of claim 33, wherein the bottom terminal comprises a first source/drain terminal, the top terminal comprises a second source/drain terminal and the second top terminal comprises a gate terminal.

35. The method of claim 27, further comprising:
attaching a substrate to the first and second contact elements, wherein the substrate has a recess or a through-hole for accommodating the protruding element protruding from the electrically insulating material or has a protruding element protruding into the recess in the electrically insulating material.

* * * * *